United States Patent [19]

Curran

[11] Patent Number: 4,704,785

[45] Date of Patent: Nov. 10, 1987

[54] PROCESS FOR MAKING A BURIED CONDUCTOR BY FUSING TWO WAFERS

[75] Inventor: Patrick A. Curran, Plano, Tex.

[73] Assignee: Texas Instruments Incorporated, Dallas, Tex.

[21] Appl. No.: 893,437

[22] Filed: Aug. 1, 1986

[51] Int. Cl.[4] .................... H01L 21/385; H01L 21/40
[52] U.S. Cl. .................................. 437/110; 437/247; 437/180
[58] Field of Search .................... 29/576 J, 582, 591; 148/175, 187

[56] References Cited

U.S. PATENT DOCUMENTS

| | | | |
|---|---|---|---|
| 3,069,603 | 12/1962 | Hunter | 29/576 J |
| 3,239,908 | 3/1966 | Nakamura | 29/576 J |
| 3,274,454 | 9/1966 | Haberecht | 29/576 J |
| 3,290,760 | 12/1966 | Cave | 29/576 J |
| 3,303,549 | 2/1967 | Peyser | 29/576 J |
| 3,333,324 | 8/1967 | Roswell et al. | 29/576 J |
| 3,355,636 | 11/1967 | Becke et al. | 29/576 J |
| 3,375,143 | 3/1968 | Garner et al. | 29/576 J |
| 3,503,125 | 3/1970 | Haberecht | 29/576 J |
| 4,237,600 | 12/1980 | Rosen et al. | 29/576 J |
| 4,516,314 | 5/1985 | Sater | 29/576 J |
| 4,525,593 | 6/1985 | Yablonovitch | 136/255 |
| 4,612,083 | 9/1986 | Yasumoto et al. | 29/576 J |
| 4,621,413 | 11/1986 | Lowe | 148/187 X |
| 4,638,552 | 1/1987 | Shimbo et al. | 29/576 J |

Primary Examiner—George T. Ozaki
Attorney, Agent, or Firm—Gary C. Honeycutt; Rhys Merrett; Melvin Sharp

[57] ABSTRACT

A process, and product made thereby, for bonding two wafers together to form a single wafer with a continuous interface, and for selectively burying a low impedance conductor in the wafer, by providing host and guest wafers having substantially the same crystal orientation and periodicity. A crystalline boundary n-semimetal is formed on the wafers, which are then brought into intimate contact. If desired, a unipolar conductor is fused to one of said wafers. Then, the wafers are exposed to an elevated temperature, or rapid thermal anneal, in an inert ambient, breaking up any native oxides and diffusing any excess oxygen into the wafer lattices. The guest wafer is then mechanically lapped back and chemically etched.

A vertical cascode integrated half H-bridge motor driving circuit made in the guest and host wafers has a source transistor in the host wafer with with the wafer substrate forming the collector of the transistor, an isotype acceptor doped $Ge_xSi_{1-x}/Si$ superlattice forming the base, and an overlying a monocrystalline silicon layer forming a compositional emitter, and with an n-semimetal boundary. The sink transistor of the guest is made with the wafer substrate forming the emitter, an isotype acceptor doped $Ge_xSi_{1-x}/Si$ superlattice forming the base, and an overlying a monocrystalline silicon layer forming the compositional collector. The guest substrate is terminated with an n-semimetal boundary. A buried conductor contacts the collector of the host transistor and the emitter of the guest transistor.

9 Claims, 7 Drawing Figures

PROCESS FOR MAKING A BURIED CONDUCTOR BY FUSING TWO WAFERS

BACKGROUND OF THE INVENTION

1. Field of the Invention

This invention relates to improvements in processes for fabricating wafer structures, and more particularly to a process for bonding two separately processed wafers together to form a single wafer with an continuous interface therebetween; to a process for burying a low impedance conductor in the crystalline lattice substrate of the single formed wafer; to the product formed by the process of the invention is presented; and to a vertical cascode integrated half H-bridge circuit and method for making same.

2. Description of the Relevant Art

Wafer fusion is a known process in which two separately processed wafers, referred to as guest and host wafers, are bonded together to form a single wafer, ideally, with a continuous interface between them. Each of the wafers are individually processed, and may contain combinable portions of a particular integrated circuit to be fabricated. In many high current applications, a low impedance conductor buried in a semiconductor crystalline lattice is needed for lateral conduction with low ohmic drops within the wafer joining interface. Buried diffusions have limited conductivity and suffer severe diffusion effects from subsequent thermal anneals associated with epitaxial depositions and diffusions.

In copending U.S. patent application Ser. No. 876,322, filed June 19, 1986, entitled "SEMIMETAL-SEMICONDUCTOR CONTACT SYSTEM", by the applicant hereof, assigned to the assignee hereof, and incorporated herein by reference as background, a semiconductor contact system is described in which electrical contact to a semiconductor region controls the boundary recombination velocity in order to optimize the semiconductor transport phenomena. The contact system includes a doped microcrystalline layer which is acceptor and oxygen doped, P$^-$ semimetal, to provide unipolar hole transport and donor and oxygen doped, N$^-$ semimetal, to provide unipolar electron transport. The semimetal is achieved by implanting oxygen and doping several atomic layers into a semiconductor region below the microcrystalline layer so that the monocrystalline lattice of the semiconductor region is not abruptly terminated, and the lattice periodicity is not disrupted. Thus, the semimetal layer is formed of doped silicon microcrystals and a surrounding silicon oxide layer. The thickness of the semimetal layer is adjusted to be thick enough to control the effective chemostatic potential terminating the semiconductor crystal and thin enough to enhance the series resistance of the semimetal layer.

SUMMARY OF THE INVENTION

In accordance with a broad aspect of the invention, a process for bonding two separately processed wafers together to form a single wafer with an continuous interface therebetween is presented, and in one embodiment, a process for burying a low impedance conductor in the crystalline lattice substrate of the single formed wafer is presented. In performing the process host and guest wafers, each having substantially the same crystal orientation with nearly identical periodicity are provided. A crystalline boundary n-semimetal may be formed on the wafers followed by the deposition of a layer of crystalline $NiSi_2$. If desired, at least one unipolar conductor is fused to one of said wafers. The host and guest wafers are then brought into intimate contact at an elevated temperature in an inert ambient to break up the native oxides and diffuse any excess oxygen into the host and guest lattices. In one embodiment, the elevated temperature is created by a rapid thermal anneal, for instance in the presence of a halogen lamp, at a temperature of about 1000° C. for about 60 seconds. The guest portion of the fused wafer is mechanically lapped back then chemically etched with an anisotropic silicon etchant to achieve the desired structure.

In accordance with another broad aspect of the invention, the product formed by the process of the invention is presented.

In still another broad aspect of the invention, a vertical cascode integrated half H-bridge motor driving circuit is presented in which compositional double heterojunction NPN transistors are provided, respectively, on a host wafer and a guest wafer. The source transistor of the host wafer is made with the wafer substrate forming the collector of the transistor, an isotype acceptor doped $Ge_xSi_{1-x}/Si$ superlattice forming the base, and an overlying monocrystalline silicon layer forming a compositional emitter. The host wafer is terminated with an n-semimetal boundary. The sink transistor of the guest is made with the wafer substrate forming the emitter of the transistor, an isotype acceptor doped $Ge_xSi_{1-x}/Si$ superlattice forming the base, and an overlying a monocrystalline silicon layer forming the compositional collector. The guest substrate is terminated with an n-semimetal boundary. A buried conductor is provided for contacting the collector of the host transistor and the emitter of the guest transistor, and the host and guest wafers are positioned in intimate contact with each other with the buried conductor contacting the collector of the host transistor and the emitter of the guest transistor at an interface free from any native oxides and excess oxygen.

BRIEF DESCRIPTION OF THE DRAWING

The invention is illustrated in the accompanying drawing in which.

In the various figures of the drawing, the sizes and dimensions of the various parts shown may be exaggerated or distorted for ease of description or clarity of illustration. Like reference numerals are used to denote like or similar parts.

DETAILED DESCRIPTION OF THE PREFERRED EMBODIMENT(S)

Figure 1:
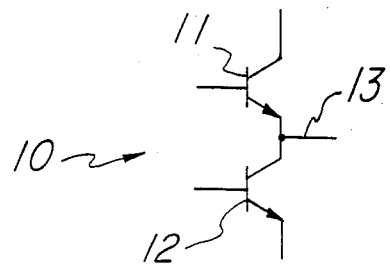
FIG. 1 shows an electrical schematic diagram of a half H-bridge circuit utilizing two NPN transistors, as an example of a circuit which can employ a buried conductor in accordance with the invention.

In accordance with a preferred embodiment of the invention, a process for joining two separately processed wafers is presented in which the wafers are automatically bonded together to form a single wafer with an automatically continuous interface between the guest and host wafers. Each of the guest and host wafers are individually processed, normally by epitaxial techniques. For illustrative purposes, a vertical cascode integrated a half H-bridge circuit 10 will be described, as shown in FIG. 1. The half H-bridge circuit 10 can be used, for example, as a motor driver, and illustrates the use a buried conductor, in accordance with a preferred embodiment of the invention. The half H-bridge circuit 10 utilizes two NPN transistors 11 and 12, which can be compositional double heterojunction transistors fabricated, for example, by techniques described in copending patent application Ser. No. 883,876, filed July 9, 1986, entitled "Compositional Double Heterojunction Transistor", by the applicant hereof, assigned to the assignee hereof and incorporated herein by reference. In accordance with the invention, a source transistor, such as trasistor 11 can be fabricated in one wafer, a cascode sink transistor 12 can be fabricated in another wafer and a connection 13 to the connection of the emitter of transistor 11 with the collector of the transistor 12 can be accomplished by a buried conductor, as described below.

Figure 2:
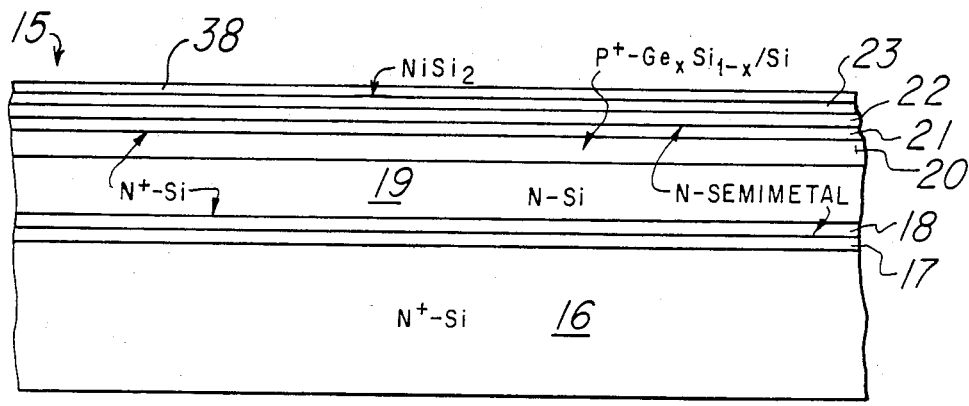
FIG. 2 is a cross sectional view of a host wafer formed of a simple substrate for receiving the half H-bridge of FIG. 1.

Thus, with reference now to FIG. 2, a host wafer 15 is shown which will carry the cascode source NPN transistor 11 with the collector as the substrate. The wafer is fabricated upon an N+ silicon substrate 16, and includes a plurality of successively deposited layers: an N-semimetal layer 17, a layer of N+ silicon 18, a layer 19 of N silicon, a $Ge_xSi_{1-x}$/Si layer 20, a layer 21 of N+ silicon, an N semimetal layer 22, and a layer 23 of $NiSi_2$. The host substrate 16 is highly donor doped <100> oriented silicon.

Figure 3:
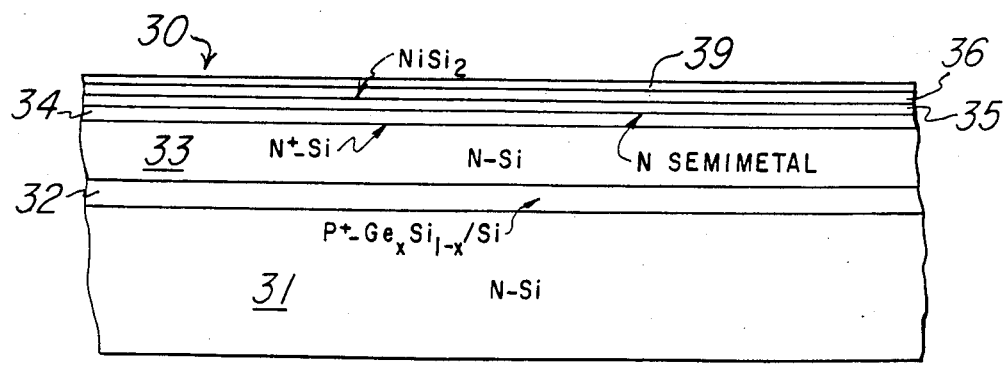
FIG. 3 is a cross sectional view of one embodiment of a guest wafer in accordance with the invention formed of crystalline $NiSi_2$ on a crystalline boundary n-semimetal.

The guest wafer 30, shown in FIG. 3, which will carry the cascode sink NPN transistor 12 and which will eventually have its substrate etched away, is fabricated upon an N+ silicon substrate 31, and includes a plurality of successively deposited layers: a $Ge_xSi_{1-x}$/Si layer 32, a layer 33 of N silicon, a layer 34 of N+ silicon, a layer 35 of N semimetal, and a layer 36 of $NiSi_2$. The guest wafer substrate is a high resistivity donor doped <100> oriented wafer.

Although any type devices can be formed in the host wafer 15, in the example illustrated, a compositional double heterojunction bipolar transistor is formed. Thus, the collector n-semimetal can be deposited by ultra high vacuum silicon-based molecular beam epitaxy techniques. The collector voltage blocking region is grown by low pressure chemical vapor deposition, molecular beam evaporation, or metal organic chemical vapor deposition. The base region is an isotype acceptor doped $Ge_xSi_{1-x}$/Si superlattice with an overlying compositional emitter comprised of a monocrystalline silicon region and an n-semimetal boundary, all grown by techniques such as silicon-based molecular beam epitaxy. The host wafer emitter semimetal boundary is contacted by a crystalline conductor, such as $NiSi_2$ or $CoSi_2$, $NiSi_2$ being shown, for example. The $NiSi_2$ is deposited by concurrent nickel and silicon evaporation in a silicon-based molecular beam epitaxy reactor or pure nickel may be evaporated and converted to crystalline $NiSi_2$ by an inert anneal. In any event, a good crystalline surface with a periodicity very close to that of silicon is achieved. It will be recognized that the host wafer may be any structure including a simple substrate with no active devices.

The guest wafer 30 may also carry any structure, so long as it has a crystal orientation similar to that of the host wafer. A structure nucleating a cascode sink NPN is described in the guest wafer. The base is constructed of a heavily acceptor doped region with germaninum counter-doping or a heavily acceptor doped $Ge_xSi_{1-x}$/Si superlattice. This permits the proper chemostatic potential for device application as well as an excellent chemical etch stop with minimal tensile stress. The collector blocking region is formed by any technique such as low pressure chemical vapor deposition, molecular beam evaporation, or metal organic chemical vapor deposition. A crystalline boundary n-semimetal is deposited as in the case with the host wafer followed by a similar crystalline $NiSi_2$.

Nature desires to seek the highest bound particle state available in order to minimize the potential energy. This is generally accomplished in many solids with covalent bonding which results in a periodic crystal for minimal degrees of freedom. Energy is initially required to form covalent bonds in order to realize a net crystal potential energy reduction. The optimal termination of a periodic bound particle system in one direction is by means of a bound particle system of identical periodicity in the other direction with sufficient activation energy to allow covalent bonding of exposed termination bonds. This presumes that all non-crystalline guest and host bonds are free and not tied up with extraneous atoms.

Figure 4:
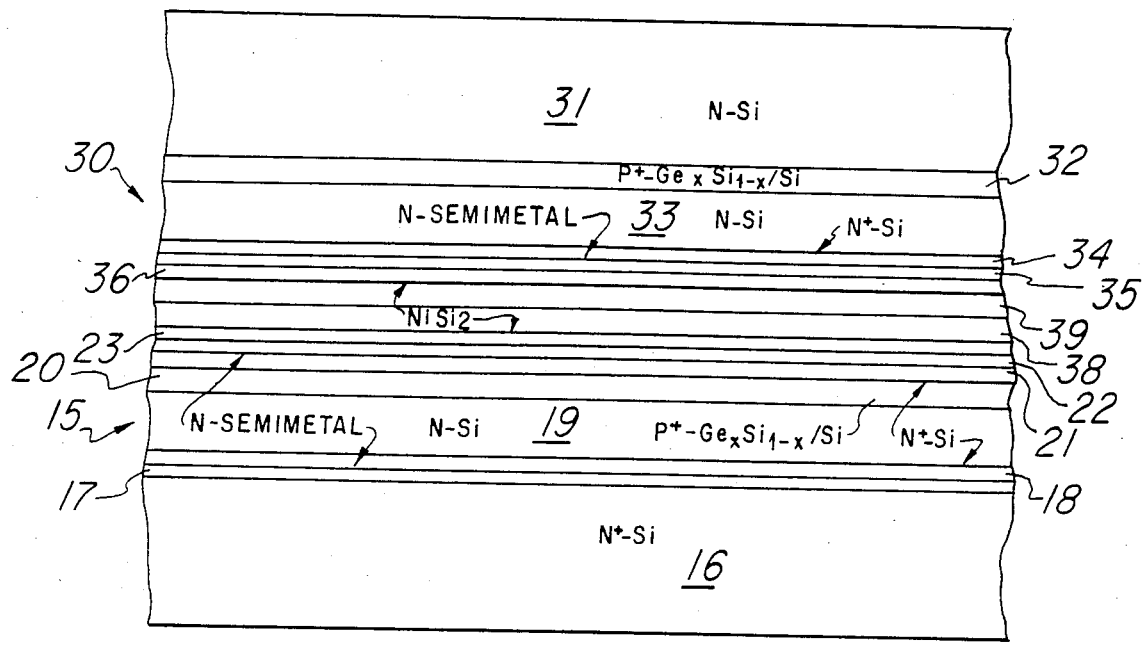
FIG. 4 is a cross sectional view of the guest and host wafers in accordance with the invention showing their relative positions prior to fusion.
Figure 5:
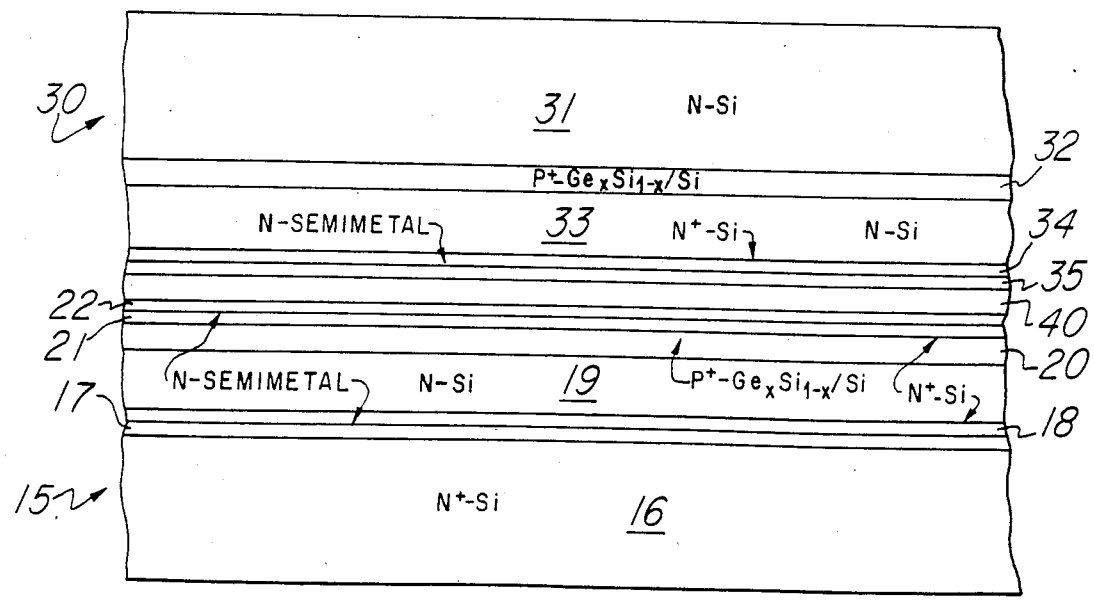
FIG. 5 is a cross sectional view of the guest and host wafers of FIG. 4 fused or annealed, for example, by rapid thermal annealing in accordance with the invention.

The process of fusing the guest and host wafers, 15 and 30, is illustrated, with particular reference now to FIG. 4. The wafers 15 and 30 are first positioned in intimate contact, with the native oxide layers 38 and 39 in contact, as shown. The wafer sandwich is then exposed to an elevated temperature in an inert ambient, which causes the thin native oxides to be broken up and the excess oxygen diffused into the host and guest lattices leaving exposed bond orbitals, forming the structure shown in FIG. 5, with a continuous layer 40 of $NiSi_2$. Thermal energy allows proper covalent bonds to be formed between the lattice atoms of the host and guest crystals, minimizing the interfacial potential energy barrier. Although fusion can be carried out in a furnace, it is believed that rapid thermal annealing, for example, using a halogen lamp anneal, produces particularly good results, exposing and joining the bond orbitals without significant diffusion or any oxidation effects. The annealing fusion can be accomplished, for instance at a temperature of about 1000° C. for about 60 seconds.

Fused wafers with excellent mechanical bond strength can result from a high, even though not ideal, periodicity at the fusion interface. Minority carrier characteristics of the fused junctions are heavily affected by any non-periodic effects. However, since the fused surface is a conductor, unipolar charge transport is desired and bipolar effects are deleterious. Consequently, any deviations from ideal periodicity simply serve to retard deleterious minority carrier effects. Therefore, fusion of unipolar conductors is desirable due to forgiveness of deviation from perfect periodicity at the fusion interface.

Figure 6:
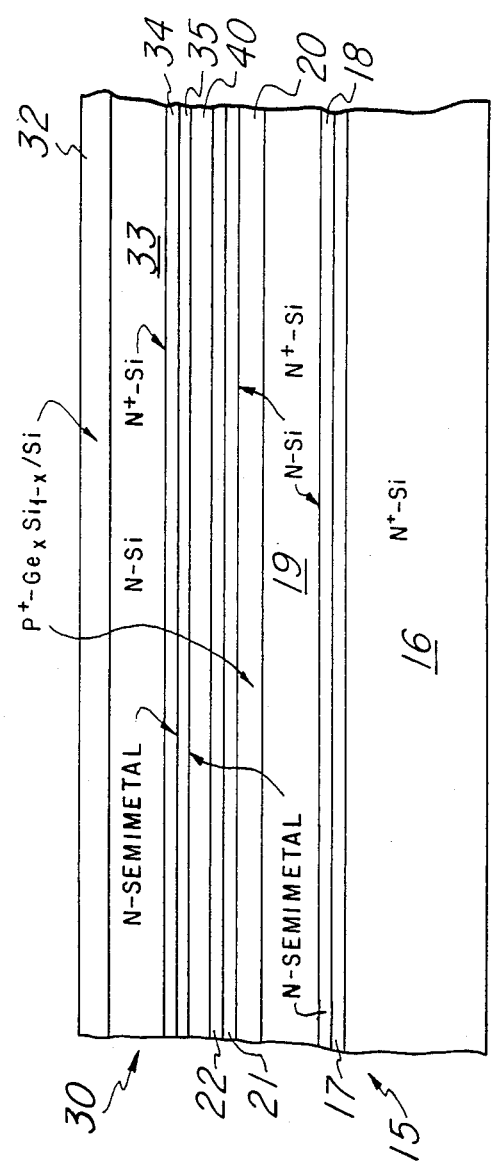
FIG. 6 is a cross sectional view showing the fused guest and host wafers of FIG. 5 after etching to form the desired exposed junction in accordance with the invention.

As shown, with reference now to FIG. 6, after fusion, the guest portion 30 of the fused wafer is mechanically lapped back to near the substrate-superlattice junction and then chemically etched. Although numerous chemical etchants could be employed, an anisotropic silicon etchant such as propanol diluted potassium hydroxide is believed to be a particularly suitable etchant. With this type of etchant at a temperature of about 85° C. the lightly doped guest wafer substrate will etch rapidly, approximately one micron per minute, while the heavily acceptor doped region is virtually immune to etching. The desired junction is exposed as shown.

Processing can continue per any number of techniques. For the example of this disclosure, a compositional emitter comprised of a monocrystalline silicon region and an n-semimetal is deposited by silicon-based molecular beam epitaxy techniques as described in the aforereferenced patent application Ser. No. 876,322.

Figure 7:
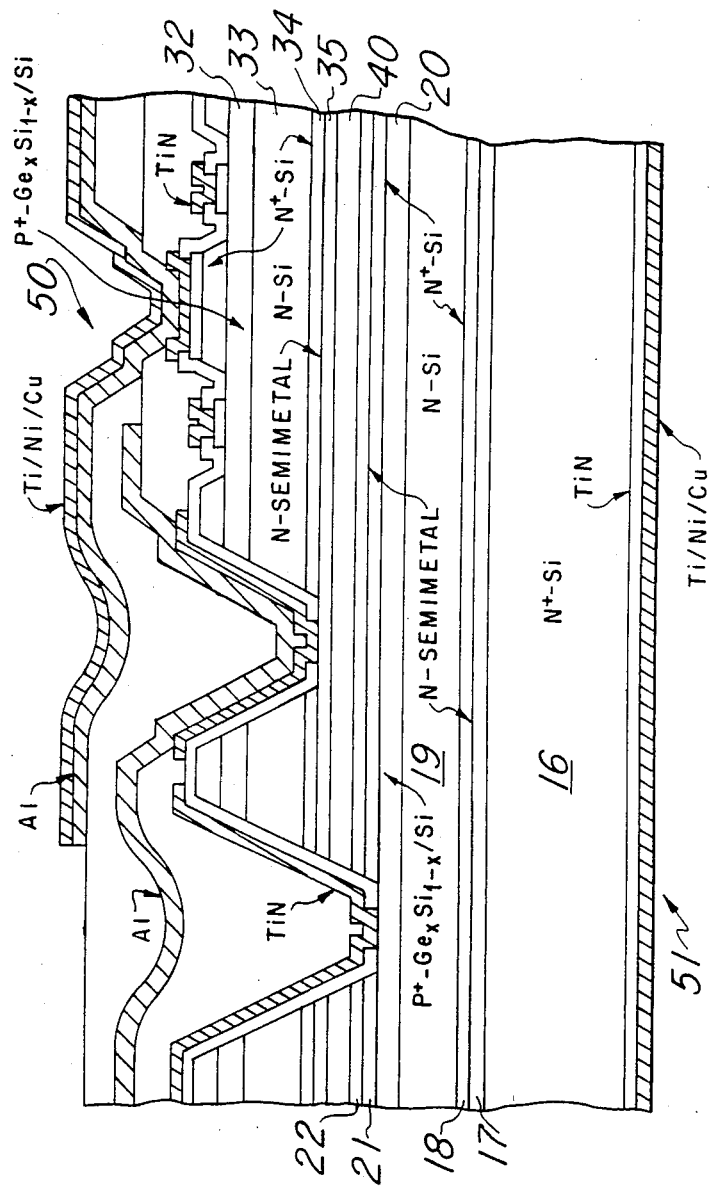
FIG. 7 is a cross sectional view of a resultant structure by which the cascode half H-bridge element of FIG. 1 is formed, in accordance with the invention, with ground and back side metal bus structures, a buried lateral conductor output power bus and a separate, dielectrically isolated metal bus on the upper wafer surface.

Further transistor delineation and contact can be achieved by wafer processing with contact to the buried conductor by means of anisotropic silicon etching. The wafer processing can be accomplished, for example, by the processing techniques described in the aforementioned copending patent application Ser. No. 883,876, filed July 9, 1986, entitled "COMPOSITIONAL DOUBLE HETEROJUNCTION TRANSISTOR". The resultant cascode half H-bridge element is shown in FIG. 7. The half H-bridge ground and supply power connections are via front side and back side metal bus structures 50 and 51. The half H-bridge output power bus is by means of the buried lateral conductor 40 and a separate, dielectrically isolated metal bus (not shown) on the upper wafer surface. Efficient silicon utilization and power bus structure results.

Although the invention has been described and illustrated with a certain degree of particularity, it is understood that the present disclosure has been made by way of example only and that numerous changes in the combination and arrangement of parts or steps may be resorted to by those skilled in the art without departing from the spirit and the scope of the invention as hereinafter claimed.

I claim:

1. A process for making a buried low impedance conductor in a crystalline lattice substrate, comprising:
   providing a host wafer;
   providing a guest wafer having a crystal orientation substantially the same as that of the host wafer;
   fusing at least one unipolar conductor layer to one of said wafers; and
   bringing the host and guest wafers into intimate contact at an elevated temperature in an inert ambient with said unipolar conductor therebetween, whereby native oxides are broken up and any excess oxygen is diffused into the host and guest lattices leaving exposed bond orbitals.

2. The process of claim 1 further comprising providing wafers having nearly identical periodicity for said host and guest wafers.

3. The process of claim 1 wherein said elevated temperature is created by rapid thermal annealing.

4. The process of claim 3 wherein said rapid thermal annealing is a halogen lamp anneal.

5. The process of claim 4 wherein said anneal is performed at a temperature of about 1000° C. for a time of about 60 seconds.

6. The process of claim 1 further comprising depositing a crystalline boundary n-semimetal on the guest and host wafers followed by depositing a layer of crystalline silicide thereon.

7. The process of claim 1 further comprising mechanically lapping back the guest portion of the fused wafer after fusion and then chemically etching the structure.

8. The process of claim 7 wherein said step of chemically etching the structure comprises etching using an anisotropic silicon etchant.

9. The process of claim 8 wherein said step of using an anisotropic silicon etchant comprises using propanol diluted potassium hydroxide at a temperature of about 85° C.

* * * * *